US009338876B2

(12) United States Patent
Bäuml et al.

(10) Patent No.: US 9,338,876 B2
(45) Date of Patent: May 10, 2016

(54) AUTOMATION DEVICE HAVING A HEATSINK

(71) Applicants: Mathias Bäuml, Schwandorf (DE); Julia Michl, Schwandorf (DE); Jürgen Schmelz, Winkelhaid (DE)

(72) Inventors: Mathias Bäuml, Schwandorf (DE); Julia Michl, Schwandorf (DE); Jürgen Schmelz, Winkelhaid (DE)

(73) Assignee: Siemens Aktiengesellschaft, Munich (DE)

( * ) Notice: Subject to any disclaimer, the term of this patent is extended or adjusted under 35 U.S.C. 154(b) by 157 days.

(21) Appl. No.: 14/090,608

(22) Filed: Nov. 26, 2013

(65) Prior Publication Data

US 2014/0146476 A1        May 29, 2014

(30) Foreign Application Priority Data

Nov. 27, 2012   (EP) .................................... 12194363

(51) Int. Cl.
*H05K 7/20*        (2006.01)
*H05K 1/02*        (2006.01)
*H05K 7/14*        (2006.01)

(52) U.S. Cl.
CPC ............ *H05K 1/0203* (2013.01); *H05K 7/1464* (2013.01); *H05K 7/2039* (2013.01); *H05K 7/20127* (2013.01); *H05K 7/20154* (2013.01)

(58) Field of Classification Search
CPC .......... H05K 7/20154; H05K 7/20163; H05K 7/20909; H05K 7/20918; H01L 23/36; H01L 23/367; H01L 23/3672; H01L 23/3675; H01L 23/3677; H01L 2023/4037; H01L 2023/4043; H01L 2023/405; H01L 2023/4056; H01L 2023/4062; H01L 2023/4068
USPC ........ 361/379.47, 379.54, 697, 702, 709–711
See application file for complete search history.

(56) References Cited

U.S. PATENT DOCUMENTS

| | | | |
|---|---|---|---|
| 6,324,057 B1 | 11/2001 | Baran et al. | |
| 6,845,013 B2 * | 1/2005 | Hartke | H05K 1/141 165/185 |
| 7,064,955 B2 * | 6/2006 | Harris | G06F 1/184 165/80.3 |
| 2001/0011597 A1 | 8/2001 | Imoto | |
| 2003/0181075 A1 * | 9/2003 | Hartke | H05K 1/141 439/67 |

(Continued)

FOREIGN PATENT DOCUMENTS

| | | |
|---|---|---|
| CN | 201418226 | 3/2010 |
| CN | 201853182 | 6/2011 |

(Continued)

*Primary Examiner* — Adam B Dravininkas
(74) *Attorney, Agent, or Firm* — Cozen O'Connor (57) ABSTRACT

An automation device configured for an automation environment and for automating an industrial process includes a first printed circuit board, a second printed circuit board, a first electronic component arranged on the first printed circuit board and a second electronic component arranged on the second printed circuit board, a heatsink arranged on the first printed circuit board, wherein the first electronic component is arranged between the first printed circuit board and the heatsink, the heatsink has a cuboid shape and rests on the first electronic component with a first cooling contact surface incorporated in a first lateral surface of the cuboid and a second cooling contact surface incorporated in a second lateral surface of the heatsink rests on the second electronic component, and the second printed circuit board is arranged essentially vertically with respect to the first printed circuit board.

7 Claims, 8 Drawing Sheets

(56) References Cited

U.S. PATENT DOCUMENTS

| | | | |
|---|---|---|---|
| 2004/0027802 A1* | 2/2004 | Duerbaum | H05K 1/141 361/688 |
| 2006/0109625 A1* | 5/2006 | Harris | G06F 1/184 361/695 |
| 2006/0109626 A1* | 5/2006 | Harris | H05K 7/1092 361/695 |
| 2007/0119049 A1 | 5/2007 | Teranaka | |
| 2008/0117593 A1* | 5/2008 | Andric | H01L 23/34 361/697 |
| 2010/0134967 A1 | 6/2010 | Gaub et al. | |

FOREIGN PATENT DOCUMENTS

| | | |
|---|---|---|
| CN | 202095182 | 12/2011 |
| DE | 103 16 967 | 10/2004 |
| EP | 0 845 930 | 6/1998 |
| EP | 1 793 289 | 6/2007 |
| EP | 2 073 616 A2 | 6/2009 |
| EP | 2 187 716 | 5/2010 |

* cited by examiner

AUTOMATION DEVICE HAVING A HEATSINK

BACKGROUND OF THE INVENTION

1. Field of the Invention

The invention relates to an automation device configured for use in an automation environment and for automating an industrial process, where the device comprises a first printed circuit board, a second printed circuit board, a first electronic component requiring to be cooled and a second electrical component requiring to be cooled, where the first electronic component requiring to be cooled is arranged on the first printed circuit board and the second electronic component requiring to be cooled is arranged on the second printed circuit board, and where a heatsink is arranged on the first printed circuit board and the first electronic component is arranged between the first printed circuit board and the heatsink, the heatsink is in this case cuboid shaped and rests on the first electronic component with a first cooling contact surface incorporated in a first lateral surface of the heatsink.

2. Description of the Related Art

The miniaturization of electronics components has resulted in the increasing realization of higher packing densities/functional densities of electronic components on a flat wiring module, such as a populated printed circuit board. This leads to an increase in the power dissipation loss, in particular in the case of microprocessors, because the performance of microprocessors is steadily increasing and consequently so also are the thermal losses.

Typically, one or more electronic components mounted on a printed circuit board are thermally coupled to a heatsink. When there are a plurality of printed circuit boards in an electronic device, it is also known to assign a separate heatsink to each of the plurality of printed circuit boards. An electronic device can therefore contain a plurality of heatsinks which cannot be fully utilized in total. The inevitable consequence is a lower power density than would be theoretically possible.

The computing power of an automation device leads to a power dissipation loss. The higher the computing power, the higher the power dissipation loss (heat). The processors used are becoming ever more powerful, so the power dissipation loss is increasing as a result. At the same time, it is a desire to shrink the external dimensions of the automation device more and more. This means that more and more heat must be dissipated from smaller and smaller housings.

Thus, the power density is ultimately power (dissipation loss) per unit of volume, such as watts per dm^3.

For these reasons, greater and greater technical efforts must be undertaken to stay within the permitted temperatures.

SUMMARY OF THE INVENTION

It is an object of the invention to increase the power density of an automation device.

This and other objects and advantages are achieved in accordance with the invention by an automation device in which the second printed circuit board is arranged essentially vertically with respect to the first printed circuit board, where a second cooling contact surface incorporated in a second lateral surface of the heatsink rests on the second electronic component. Accordingly, two printed circuit boards together with their respective electronic components can be thermally coupled to one heatsink. Toward that end, a second cooling base is, for example, mounted on the heatsink at right angles to the first cooling base for the purpose of coupling in heat. In this case, optimal use is made of the available installation space. The performance capacity of the heatsink can therefore be exploited in the best possible way. The efficiency of the overall system becomes greater because of the increase in the maximum possible power dissipation loss referred to the installation space.

In an advantageous embodiment, the second printed circuit board is secured to the second lateral surface of the heatsink. In particular, when automation components are used in an industrial environment, vibrations can act upon the automation device. If the second printed circuit board is connected to the second lateral surface of the cuboid-shaped heatsink, the probability of the second printed circuit being subjected to mechanical stress is reduced.

In a further optimized embodiment of the automation device, a basic housing is provided, where the heatsink is connected by its first lateral surface to the basic housing by a locating bearing, and where the first printed circuit board is arranged between an inside face of a bottom side of the basic housing and the first lateral surface of the heatsink. In addition, an outside face of the bottom side of the basic housing is formed with a fastener for allowing mounting to a vertical component, where in the assembled state of the basic housing the bottom side is aligned in parallel with the component, and where the second lateral surface of the cuboid-shaped heatsink is selected such that the second printed circuit board is arranged parallel to a flow direction of a medium flowing through the basic housing. In particular, automation devices are preferably snapped onto a profile rail with their backside via a device, such as a snap-fit, thereby enabling various automation components to be arranged side by side in a row on the profile rail, such as in a switching cabinet or on a wall. In this case, the automation device requiring to be cooled is oriented in such that, for example, the ambient air acting as a cooling medium can flow as a result of thermal convection through the housing in order to provide cooling. The second printed circuit board is aligned parallel to the flow direction of the cooling air, for example. As a result, the cooling air can flow in an optimal manner past the second printed circuit board and the cooling ribs.

In order to withstand the particularly harsh industrial conditions, such as vibrations, shock and shaking loads, to which automation devices are subject, the automation device has, in another advantageous embodiment, a front hood, where the front hood can be slotted onto the basic housing and assembled to form a closed housing that encloses the heatsink, the front hood has, on an inside face of the front hood, a projecting retaining element, where a recess is arranged in a further lateral surface of the heatsink directed toward the inside face of the front hood, into which recess the retaining element engages when the housing is closed, where an elastic shaped element is arranged between the projecting retaining element and the recess, and where the elastic shaped element absorbs oscillating forces of the heatsink in three spatial axes. Because the heatsink is now no longer fixed on the bottom side of the basic housing solely via the locating bearing, stresses due to vibration and shock can be absorbed more effectively and the automation device benefits from increased robustness. Premature failure due to exposure to excessive vibration and shock stresses which can lead, for example, to housing fracture or damage to the electronic components, is therefore avoided. As a result of the embodiment of projecting retaining elements in the front hood, with the retaining elements additionally supporting an elastic shaped element and the retaining element being inserted together with the shaped element in the recesses of the heatsink, the oscillating forces of the heatsink are absorbed in the three spatial axes.

In this arrangement, the elastic shaped element is implemented such that the tolerances are compensated for, and consequently the oscillating forces are optimally absorbed in all three spatial axes. Toward that end, it is advantageous if the fastener is configured such that the basic housing can be mounted on a profile rail and the front hood together with its retaining element is configured such that the oscillating forces of the heatsink are transmitted onto the front hood and the front hood transmits the oscillating forces of the heatsink onto the basic housing and the basic housing transmits the oscillating forces of the heatsink onto the profile rail. To ensure the basic housing and front hood hold together, a plurality of latching devices are arranged between basic housing and front hood so that the two remain interlocked.

The retaining element preferably comprises a securing dome with a circumferential groove and the elastic shaped element comprises an O-ring that lies in the groove. For example, a stable plastic dome could be formed in the front hood, on which dome a groove for an O-ring is impressed. This O-ring ensures support is provided in all three spatial axes. Once the front hood has been mounted onto the basic housing, the dome together with the O-ring is, once again, seated in a cone-shaped recess in the heatsink, where contact of the O-ring against the heatsink is ensured at all times in all three spatial axes.

The recesses are advantageously cone-shaped. In the automation device with heatsink, in which a first printed circuit board having a component requiring to be cooled is arranged on a first lateral surface of the heatsink and a second printed circuit board having a component requiring to be cooled is arranged on a second lateral surface of the heatsink, the following may be cited as further advantages: Given the same overall size of the automation device, more thermal power can be dissipated; a smaller design size could be realized for the same thermal power dissipation loss; saving on material, such as aluminum, because the heatsink can be optimally dimensioned; saving in terms of production costs, with the handling of two or more heatsinks during assembly and installation being improved in contrast with a single heatsink. A logistical overhead with respect to the materials inventory would also be reduced, while additional assembly and installation devices and additional tool costs could be lowered. The housing parts can be produced to a simpler design because, for example, no separate fixing measures for the second printed circuit board are necessary in the housing.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment is illustrated in the drawing, in which.

DETAILED DESCRIPTION OF THE PREFERRED EMBODIMENTS

Figure 1:
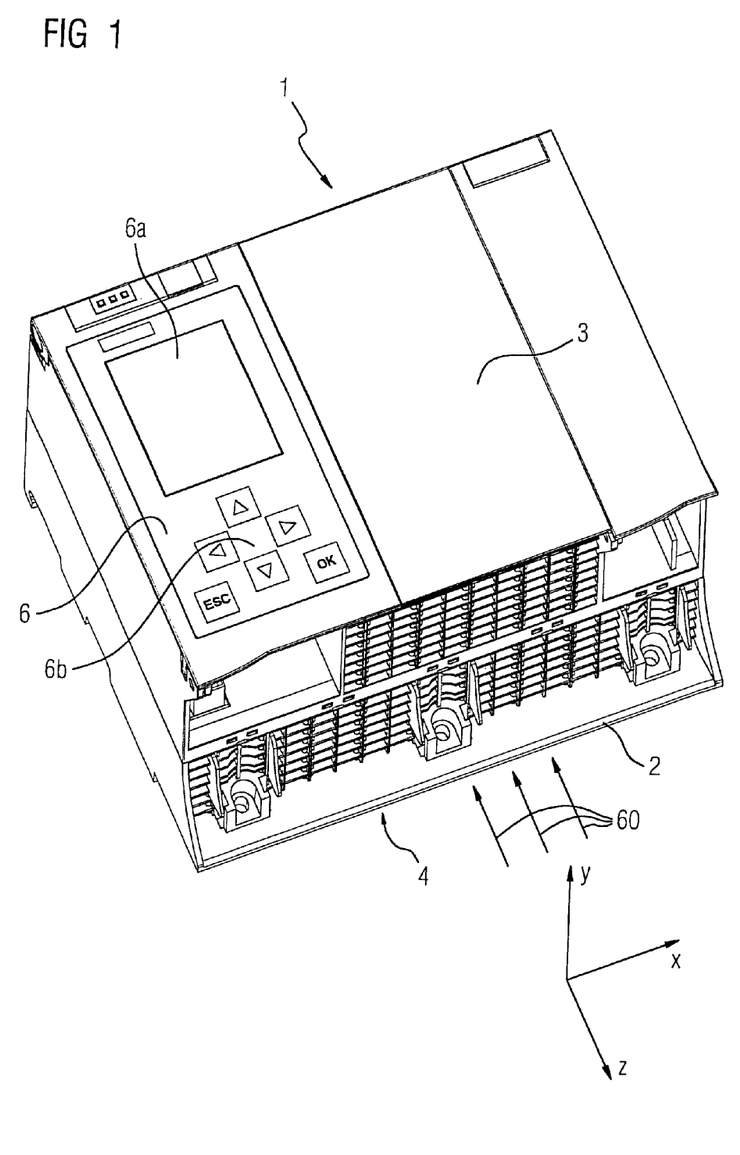
FIG. 1 shows an automation device in a three-dimensional view in accordance with the invention.

FIG. 1 shows an automation device 1 configured for an automation environment and for automating an industrial process. Because automation devices are subject to harsh environmental conditions, such as humidity, temperature differences, and/or vibration and shock loads, they must be implemented in a particularly robust design. The automation device 1 shown has a basic housing 2 and a front hood 3, with a front flap 6 having an integral display 6a and an integral control panel 6b additionally being depicted.

Shown below the automation device 1 are three spatial axes x,y,z. When subject to stress in the form of a shock, jolt or vibration, the automation device 1 and in particular the inner workings of the automation device 1 can move in the three spatial axes x,y,z. In this perspective view of the automation device 1 of FIG. 1 can be seen a ventilation grille which allows a through-flowing medium, such as air, to pass through the basic housing 2 in a flow direction 60 for the purpose of cooling the components or, as the case may be, a heatsink 20.

Figure 2:
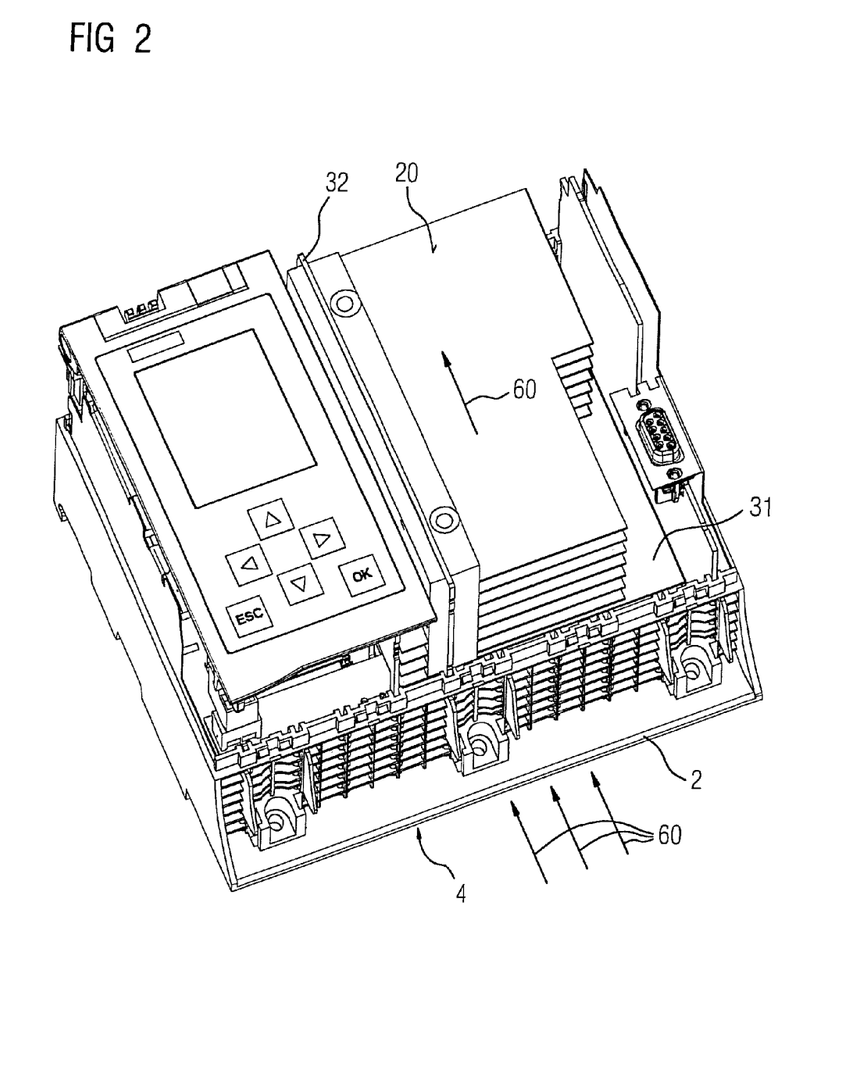
FIG. 2 shows the automation device of FIG. 1 open with a view onto the heatsink.

FIG. 2 shows the automation device 1 of FIG. 1 in an open state with the front hood 3 removed. The heatsink 20, which is arranged on a first printed circuit board 31, is now clearly to be seen. The first printed circuit board 31, in turn, is seated on a bottom side 4 of the basic housing 2 (see also FIG. 3). A second printed circuit board 32 stands essentially vertically on the first printed circuit board 31.

Figure 3:
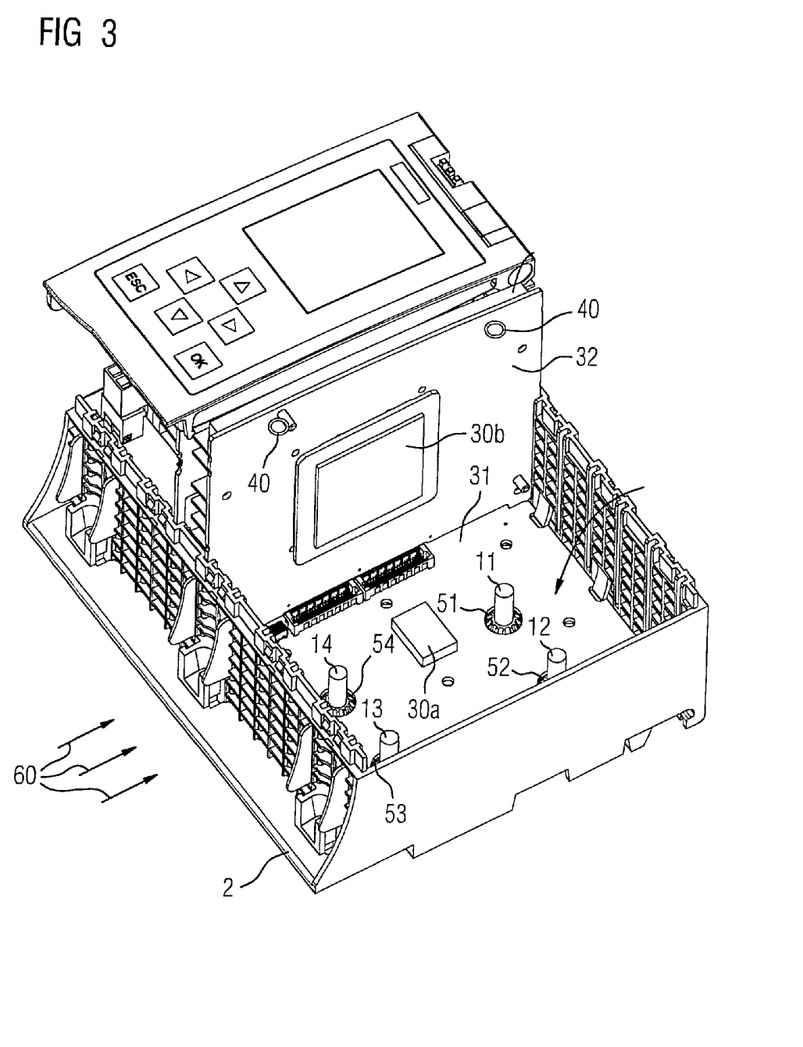
FIG. 3 shows the open automation device of FIG. 2 without the heatsink, with a view onto the first printed circuit board and the second printed circuit board.
Figure 5:
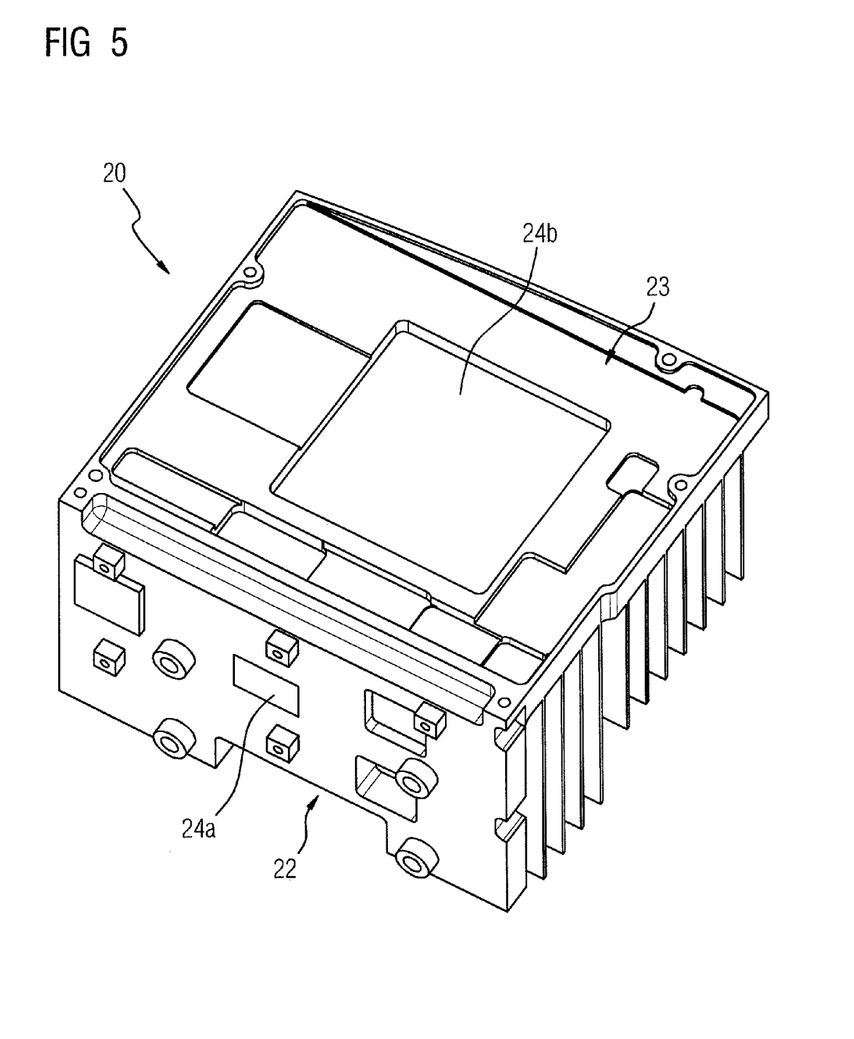
FIG. 5 shows the heatsink of FIG. 4 in a view rotated in comparison to FIG. 4.

As shown in FIG. 3, the first printed circuit board 31 has a first electronic component 30a and the second printed circuit board 32 has a second electronic component 30b. The heatsink 20 is arranged on the first printed circuit board 31 such that the first electronic component 30a is arranged between the first printed circuit board 31 and the heatsink 20. In this case, the heatsink 20 is cuboid shaped and rests on the first electronic component 30a with a first cooling contact surface 24a (see FIG. 5) incorporated in a first lateral surface 22 of the cuboid.

The second printed circuit board 32 is arranged essentially vertically with respect to the first printed circuit board 31. As a result, the second electronic component 30b arranged on the second printed circuit board 32 can come into contact with the heatsink 20 in a second cooling contact surface 24b incorporated inside a second lateral surface 23 of the heatsink 20.

The heatsink 20 is connected by its first lateral surface 22 to the basic housing 2 via locating bearings 11,12,13,14. The second printed circuit board 32 is secured to the second lateral surface 23 of the cuboid-shaped heatsink 20.

FIG. 3 shows the automation device 1 with the heatsink 20 removed. In this case, the second printed circuit board 32 shows that it is carrying the second electronic component 30b. The first printed circuit board 31 has a first aperture 51, a second aperture 52, a third aperture 53 and a fourth aperture 54. A stud bolt projects through each of the apertures 51,52, 53,54. The screwed connections of the heatsink 20 to the respective stud bolt form a first locating bearing 11, a second locating bearing 12, a third locating bearing 13 and a fourth locating bearing 14.

Figure 4:
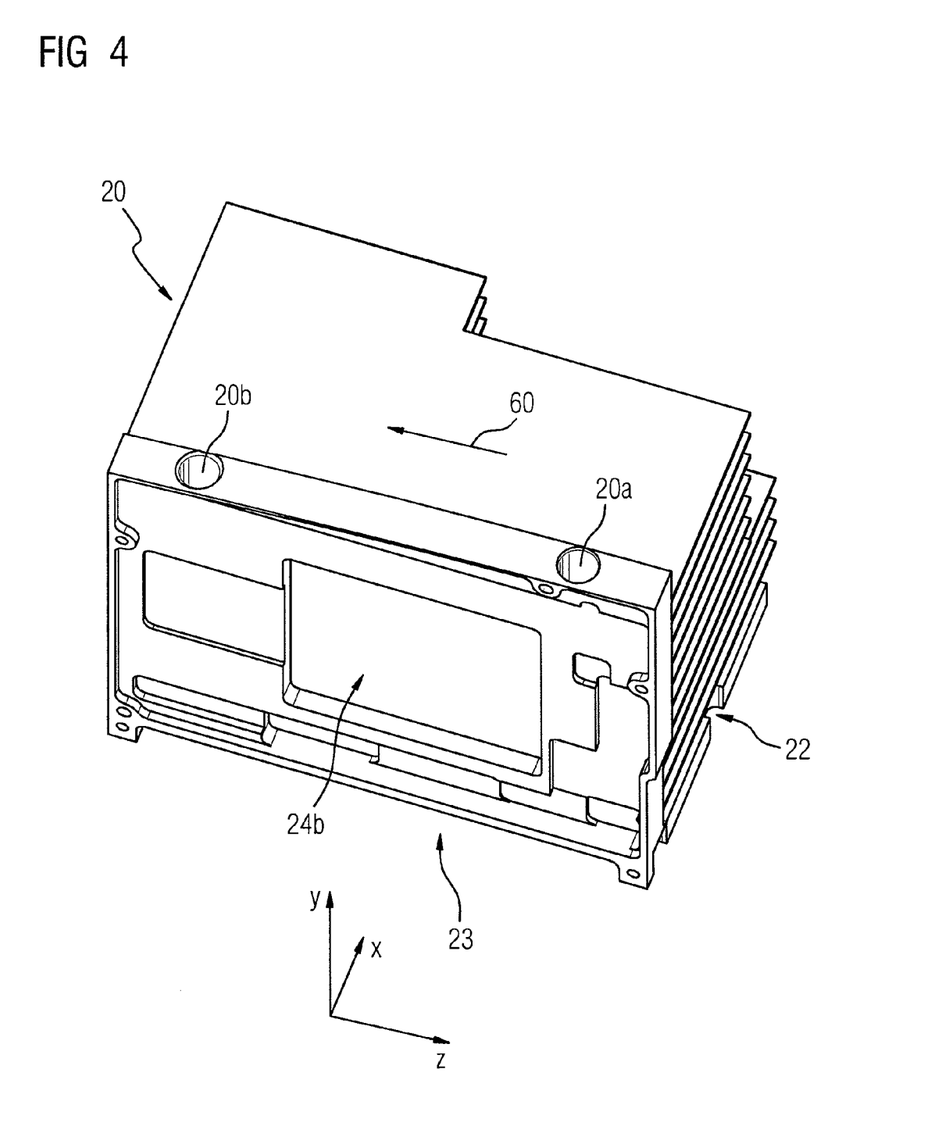
FIG. 4 shows a three-dimensional view of the heatsink in accordance with the invention.

According to FIG. 4, the heatsink 20 is depicted in an individual view. The view falls onto the second lateral surface 23 in which a rectangular recess which forms the second cooling contact surface 24b can be seen. In this perspective view of the heatsink 20, the heatsink 20 effectively stands on the first lateral surface 22. According to FIG. 5, the heatsink 20 is rotated in contrast to the view shown in FIG. 4 such that the view now falls onto the first lateral surface 22. The first lateral surface 22 has a rectangular first cooling contact surface 24a for the first electronic component 30a.

Figure 6:
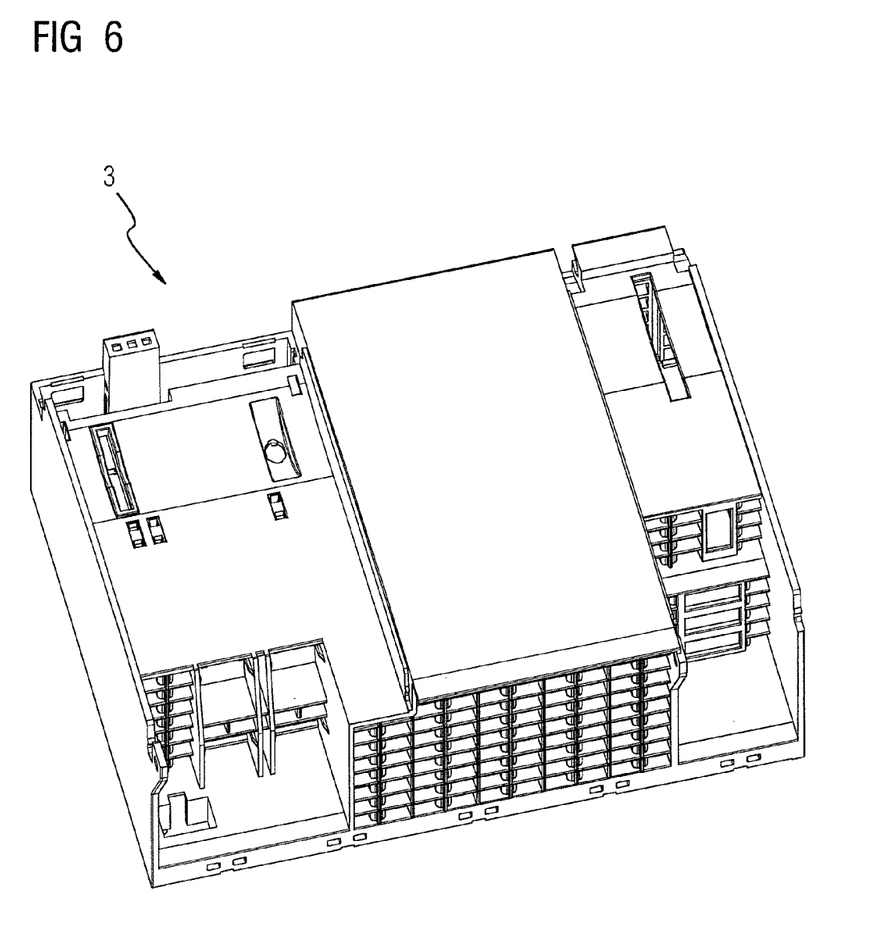
FIG. 6 shows the front hood of the automation device of FIG. 1.
Figure 7:
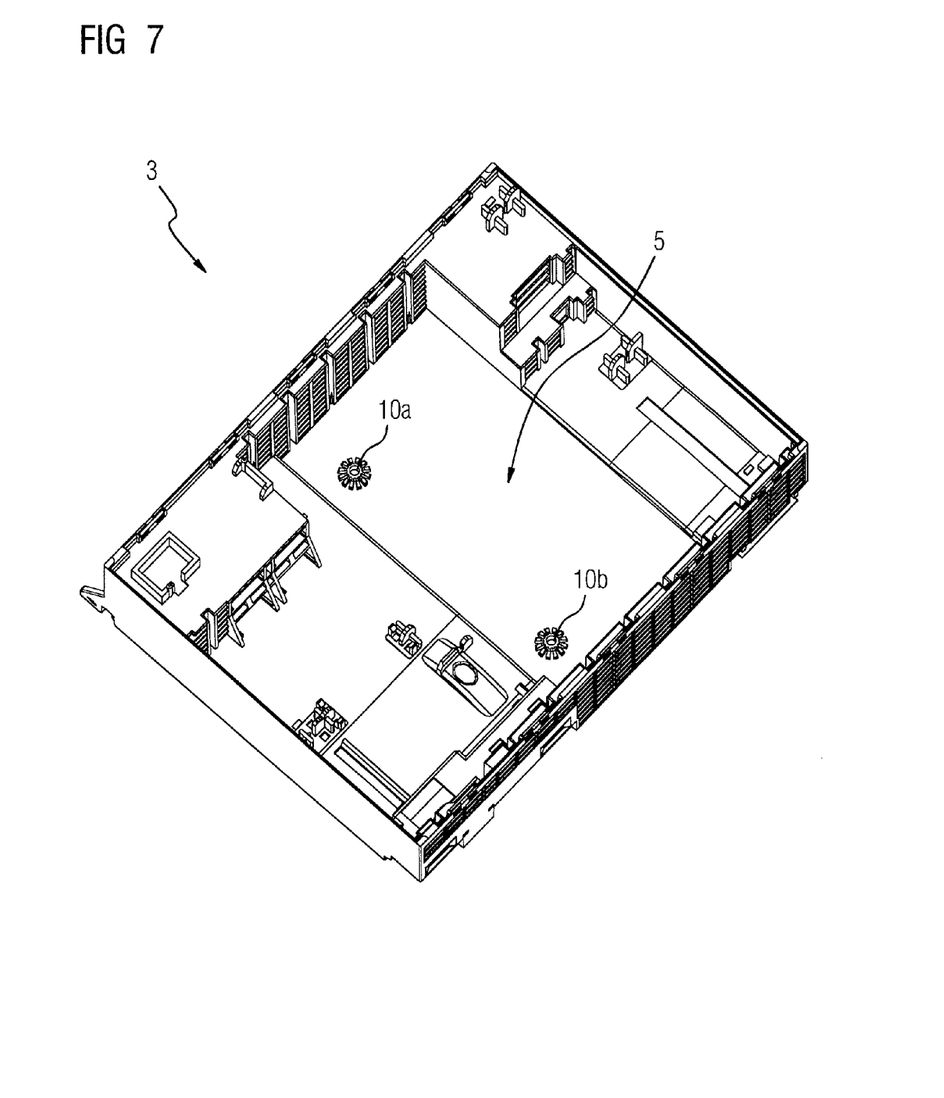
FIG. 7 shows the front hood of FIG. 6 with a view directed onto its interior.

FIG. 6 and FIG. 7 depict the front hood 3, FIG. 6 showing the front hood 3 in a plan view onto the outside and FIG. 7 showing the front hood 3 in a plan view onto the inside. The first retaining element 10a and the second retaining element 10b are shown in particular in FIG. 7. When the front hood 3 is placed onto the basic housing 2, the first retaining element 10a engages in the first recess 20a of the heatsink 20 and the second retaining element 10b engages in the second recess 20b of the heatsink 20. The heatsink 20 (see FIG. 3) has the first recess 20a and the second recess 20b in the region of an edge of the second lateral surface 23.

A first stable plastic dome and a second stable plastic dome, which are mounted on the inside of the front hood 3, can engage in the first and the second recess 20a,20b respectively. In order to achieve optimal support in all three spatial axes x,y,z, the plastic dome in each case has a groove 41 for an O-ring.

Figure 8:
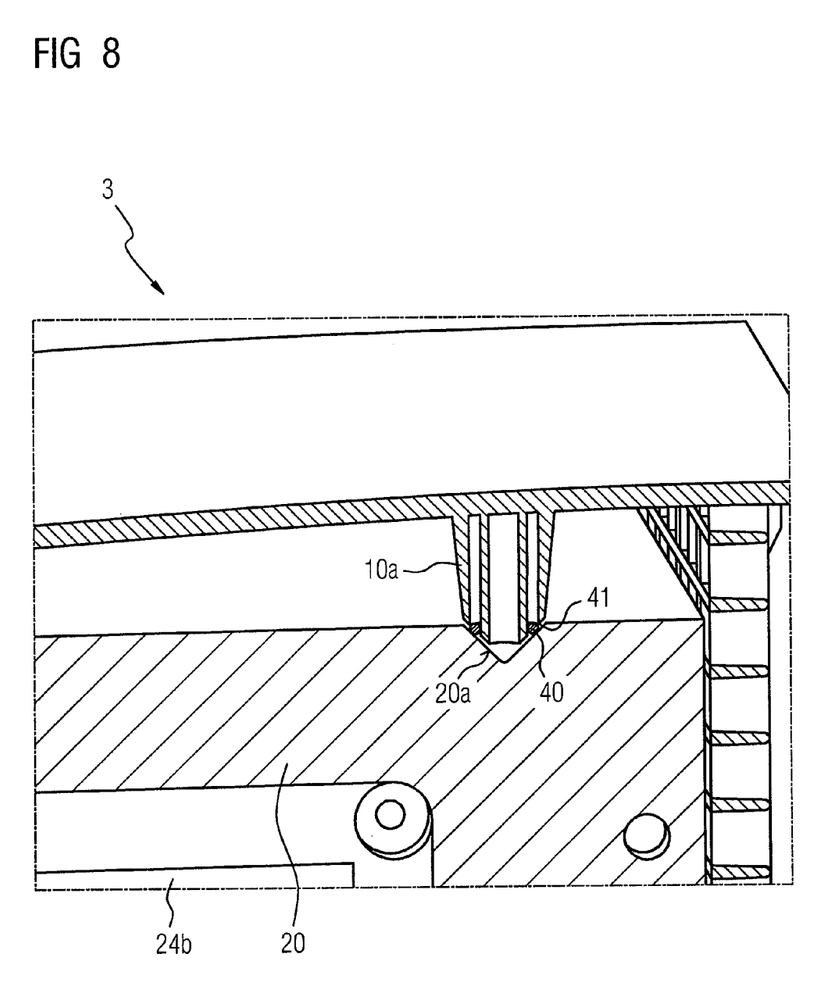
FIG. 8 shows a section through the front hood, the retaining element and the heatsink at the position of the recess.

The arrangement of the O-ring is illustrated in FIG. 8, which shows a sectional view. In FIG. 8, the plastic dome is represented as the first retaining element 10a. The plastic dome has a circumferential groove 41 in which an elastic shaped element 40, specifically the O-ring, is inserted. The second cooling contact surface 24b for the second electronic component 30b can be seen in outline on the heatsink 20.

After the front hood 3 has been mounted onto the basic housing 2, the plastic domes with O-ring are once again located in the cone-shaped recess in the heatsink 20, a contact of the O-ring against the heatsink 20 within the cone-shaped recess being ensured at all times in all three spatial axes x,y,z. In this way, it is ensured without great additional expenditure on a fastener that the generation of great forces is avoided in all directions, specifically along the three spatial axes x,y,z, and consequently the automation device 1 is relieved of mechanical load, thus being rendered very robust.

Thus, while there have shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An automation device configured for an automation environment and for automating an industrial process, comprising:
   a first printed circuit board;
   a second printed circuit board arranged essentially vertically with respect to the first printed circuit board;
   a first electronic component to be cooled, the first electronic component being arranged on the first printed circuit board;
   a second electronic component requiring to be cooled, the second component being arranged on the second printed circuit board;
   a heatsink arranged on the first printed circuit board, formed in a cuboid shape and resting on the first electronic component, a first cooling contact surface being incorporated in a first lateral surface of the cuboid, and a second cooling contact surface incorporated in a second lateral surface of the heatsink rests on the second electronic component, the first electronic component being arranged between the first printed circuit board and the heatsink;
   a basic housing;
   a front hood which is slottable onto the basic housing and assembled to form a closed housing which encloses the heatsink, the front hood including, on an inside face of the front hood, a projecting retaining element;
   a recess arranged in a further lateral surface of the heatsink directed toward the inside face of the front hood, into which recess the projecting retaining element engages when the housing is closed; and
   an elastic shaped element arranged between the projecting retaining element and the recess, the elastic shaped element being configured to absorb oscillating forces of the heatsink in three spatial axes.

2. The automation device as claimed in claim 1, wherein the second printed circuit board is secured to the second lateral surface of the heatsink.

3. The automation device as claimed in claim 2,
   wherein the heatsink is connected by the first lateral surface to the basic housing via a locating bearing;
   wherein the first printed circuit board is arranged between an inside face of a bottom side of the basic housing and the first lateral surface of the heatsink, and an outside face of the bottom side of the basic housing includes a fastener for allowing mounting to a vertical component;
   wherein in an assembled state of the basic housing the bottom side is aligned in parallel with the vertical component; and
   wherein the second lateral surface of the heatsink is selected such that the second printed circuit board is arranged parallel to a flow direction of a medium flowing through the basic housing.

4. The automation device as claimed in claim 1, wherein the fastener is configured such that the basic housing is mountable on a profile rail and the front hood together with the retaining element is configured such that the oscillating forces of the heatsink are transmitted onto the front hood which transmits the oscillating forces of the heatsink onto the basic housing and the basic housing transmits the oscillating forces of the heatsink onto the profile rail.

5. The automation device as claimed in claim 4, wherein the projecting retaining element comprises a securing dome with a circumferential groove and the elastic shaped element comprises an O-ring which lies in the groove.

6. The automation device as claimed in claim 1, wherein the projecting retaining element comprises a securing dome with a circumferential groove and the elastic shaped element comprises an O-ring which lies in the groove.

7. The automation device as claimed in claim 1, wherein the recess is cone-shaped.

* * * * *